(12) United States Patent
Scott et al.

(10) Patent No.: US 9,581,619 B2
(45) Date of Patent: Feb. 28, 2017

(54) RADIATION DETECTION

(75) Inventors: Paul Scott, Durham (GB); Ian Radley, Durham (GB)

(73) Assignee: Kromek Limited, Sedgefield (GB)

( * ) Notice: Subject to any disclaimer, the term of this patent is extended or adjusted under 35 U.S.C. 154(b) by 822 days.

(21) Appl. No.: 13/823,994

(22) PCT Filed: Nov. 18, 2011

(86) PCT No.: PCT/GB2011/052267
§ 371 (c)(1),
(2), (4) Date: Jun. 12, 2013

(87) PCT Pub. No.: WO2012/066350
PCT Pub. Date: May 24, 2012

(65) Prior Publication Data
US 2013/0275087 A1    Oct. 17, 2013

(30) Foreign Application Priority Data

Nov. 18, 2010   (GB) .................................. 1019521.2

(51) Int. Cl.
*G01R 13/02*    (2006.01)
*G01J 1/42*    (2006.01)
(Continued)

(52) U.S. Cl.
CPC ............. *G01R 13/0272* (2013.01); *G01J 1/42* (2013.01); *G01T 1/17* (2013.01); *G01T 1/24* (2013.01)

(58) Field of Classification Search
CPC ........... G01N 15/1404; G01N 15/1427; G01N 15/1429; G01N 15/1459; G01N 2015/1006;
(Continued)

(56) References Cited

U.S. PATENT DOCUMENTS 5,200,625 A * 4/1993 Kawai ....................... G01T 1/36
250/374
6,329,651 B1   12/2001 Mestais et al.
(Continued)

FOREIGN PATENT DOCUMENTS

EP         1019568 A1    7/2000
JP       2000258536 A    9/2000
(Continued)

OTHER PUBLICATIONS

Seller, P. et al., "Nucam: a 128 Channel Integrated Circuit with Pulse-Height and Rise-Time Measurement on Each Channel Including on-Chip 12bit ADC for High-Z X-Ray Detectors", 2006 IEEE Nuclear Science Symposium Conference Record, pp. 3786-3789.
(Continued)

*Primary Examiner* — John H Le
(74) *Attorney, Agent, or Firm* — Winstead PC

(57) ABSTRACT

A method of and device for processing a radiation pulse are described based on: detecting an event at the detector; producing a pulse; determining for the pulse: a pulse height measurement representative of pulse magnitude; a pulse width measurement representative of pulse duration; assigning the pulse to one of at least two classes based on the determined pulse height/pulse width; applying to each pulse an algorithm specific to its particular class to produce an output pulse height/pulse width profile.

28 Claims, 7 Drawing Sheets

(51) Int. Cl.
*G01T 1/17* (2006.01)
*G01T 1/24* (2006.01)

(58) Field of Classification Search
CPC ... G01N 2015/1075; G01N 2015/1415; G01N 2015/1438; G01N 2015/1477; G01N 2015/149; G01J 1/42; G01R 13/0272; G01T 1/17; G01T 1/24
USPC ...... 702/40, 66, 134, 189; 250/252.1, 341.6, 250/363.07; 324/314; 372/57; 435/34; 345/92
See application file for complete search history.

(56) References Cited

U.S. PATENT DOCUMENTS

| | | |
|---|---|---|
| 2007/0005271 A1 | 1/2007 | Gros D'Aillon et al. |
| 2008/0001884 A1 | 1/2008 | Eames |
| 2014/0212917 A1* | 7/2014 | Durack ............ G01N 15/1427 435/34 |

FOREIGN PATENT DOCUMENTS

| | | |
|---|---|---|
| JP | 2001242257 A | 9/2001 |
| JP | 2005017142 A | 1/2005 |
| JP | 2005249580 A | 9/2005 |
| WO | WO-99/10571 A1 | 3/1999 |
| WO | WO-2009083847 A2 | 7/2009 |

OTHER PUBLICATIONS

Skulski, W. et al., "Towards Digital γ-Ray and Particle Spectroscopy", Acta Physics Polonica B, 2000, vol. 31, sections 2.1-2.4, 11 pages.

Eberle, Katja, "International Search Report" for PCT/GB2011/052267, as mailed Sep. 5, 2012, 4 pages.

Gentet, M.C., et al., "Performance and Perspectives of a CdZnTe-Based Gamma Camera for Medical Imaging", IEEE Transactions on Nuclear Science, IEEE Service Center, New York, New York, vol. 51, No. 6, Dec. 1, 2004, pp. 3111-3117.

Auricchio, N., et al., "Compensation of CdZnTe Signals Using a Twin Shaping Filter Technique", IEEE Transactions on Nuclear Science, IEEE Service Center, New York, New York, vol. 51, No. 5, Oct. 1, 2004, pp. 2485-2491.

* cited by examiner

RADIATION DETECTION

BACKGROUND

The invention relates to a method of detection of radiation, for example high energy electromagnetic radiation such as x-rays and/or gamma rays, or subatomic particle radiation, and to a method of processing of detected radiation data from a semiconductor device for high energy physics applications, such as a detector for high energy radiation. The invention also relates to a detector device embodying the principles of the method. The invention in particular relates to a semiconductor detector device comprising a large direct band gap semiconductor material, for example a group II-VI semiconductor material such as cadmium telluride (CdTe), cadmium zinc telluride (CZT), cadmium manganese telluride (CMT) or the like, for example formed as a bulk single crystal.

Cadmium telluride and similar semiconductor materials have found application in recent years in a variety of high energy physics applications, such as high energy radiation detection. In particular their ability to resolve high energy electromagnetic radiation such as x-rays or gamma rays spectroscopically has been utilised. This may be especially the case where the material is fabricated as a bulk scale single crystal, which has become a more practical proposition as a result of the development of bulk vapour deposition techniques, for example multi-tube physical vapour phase transport methods, such as that disclosed in EP-B-1019568. For example devices may be fabricated for the detection of radiation at a detector from a suitable high energy source either directly or after interaction with an object under test, involving for example transmission, scattering, backscattering, absorption etc.

The high quantum efficiency of CdTe and CZT and CMT makes these materials ideal for high energy spectroscopy applications. However, in high count rate systems deterioration of the energy spectrum due to pulse pile up can become significant. In the case of systems which rely on an $I/I_0$ data analysis (that is, which process data by taking a ratio of the spectrum when an object is present to that when an object is not present) this can be problematic as this effect is not normalised out of an $I/I_0$ measurement owing to the differing count rates in both I and $I_0$. In addition to this, the short shaping time used in this application can result in ballistic deficit effects due to interactions far from the cathode which further degrade the detector resolution. This effect is also not normalised out by and I/Io measurement due to beam hardening in the I spectrum which results in a larger average depth of interaction. Other depth of interaction effects such as incomplete hole charge collection can also result in degraded spectral resolution. This is particularly significant in large volume high energy detectors where the drift lengths of electrons and holes to the read out electrodes are large.

Photon interactions in the detector (events) in this invention can be subject to a number of effects as a result of which the interaction event may be more or less fully collected. In addition to pulses that are substantially fully collected other pulses may be more poorly collected due to effects including without limitation depth of interaction effects within the detector, pulse pile up of very closely piled up pulses, ballistic deficit effects in the readout electronics etc.

Each presents different problems if an accurate pulse height spectrum is to be collected, particularly for an $I/I_0$ or like data analysis, and particularly at high count rate or for large detector thicknesses.

SUMMARY

According to the invention in a first aspect a method of processing of detected radiation data from a semiconductor detector device comprises the steps of:
detecting an event in a detector;
producing a pulse;
determining for the pulse:
a pulse height measurement representative of pulse magnitude;
a pulse width measurement representative of pulse duration;
assigning the pulse to one of two or more classes based on the determined pulse height/pulse width;
applying to each pulse an algorithm specific to its particular class to produce an output pulse height/pulse width profile.

Each pulse is thus processed by an algorithm specific to its particular class. This produces an output pulse height/pulse width profile, and the method preferably further comprises using the pulse height and/or width so produced for further processing.

The underlying physical mechanisms leading to a given pulse height/width value are due to a large number of effects including those noted above. Such effects lead to a spread of values across pulse height/pulse width space which may form a continuum. In a typical method, classification boundaries are drawn around regions in pulse height/pulse width space to define a class where a given algorithm is required to operate.

The selection of such boundaries and algorithms is determined by factors including the operating conditions, the major underlying detector related effects and the desired output for a given region. They do not necessarily correspond to real boundaries in what is typically a continuum distribution, and are not required to correlate to different physical effects.

It should be understood that except to the extent that it is strictly necessary, no particular order of processing of pulses need be inferred by the sequential presentation of steps in the description of the method. In accordance with the invention it is necessary merely that an input height/width dataset is collected, that it is processed by classification into at least two classes and subject to at least two processing algorithms at least one of which modifies the height/width profile of a pulse, and that an output dataset is thus produced. The classes and algorithms can either be predetermined and applied to incoming pulses for example sequentially as they are collected in real time or alternatively the height/width dataset may be first collected and then algorithms and classes defined and/or applied accordingly.

A possible example of the drawing of boundaries to produce at least two classes based on the determined pulse height/pulse width might include assigning pulses as follows:

(i) a first class if the pulse height/pulse width is within a threshold range of a first notional bounding condition of pulse height/pulse width values;

(ii) subject to (iii) below, a second class if the pulse height/pulse width is outside the threshold range;

(iii) optionally, a third class if a pulse height/pulse width otherwise in compliance with (ii) above fails to meet an acceptance criterion; and consequently:

(a) if the pulse is assigned to the first class, applying a first algorithm to produce an output pulse height/pulse width profile, and using the pulse height and/or width so produced for further processing;

(b) if the pulse is assigned to the second class, applying a second algorithm to produce an output pulse height/pulse width profile, and using the pulse height and/or width so produced for further processing;

(c) if the pulse is assigned to the third class, discarding the pulse.

The method thus comprises a method of processing of a pulse which has been generated after an interaction event in a detector. The method comprises assigning the pulse to at least one of two different classes and applying a first algorithm to produce an output pulse height/pulse width profile for a pulse assigned to the first class and a second algorithm to produce an output pulse height/pulse width profile for pulse assigned to the second class. The second algorithm differs from the first.

At least the second algorithm modifies the pulse height/pulse width profile of the pulse and the method then comprises using the pulse height and/or width so modified for further processing.

Optionally, the first algorithm may make no modification. The produced output pulse height/pulse width profile is thus unmodified, and the method then comprises using the pulse height and/or width without modification for further processing.

In this example case the method comprises (a) if the pulse is assigned to the first class, using the pulse height and/or width without further correction for further processing;

(b) if the pulse is assigned to the second class, applying a correction to modify the pulse height/pulse width profile of the pulse and using the pulse height and/or width so modified for further processing.

Thus, the method comprises at its most general assigning a pulse to one of at least two classes that are subject to different processing algorithms before further use, at least one of which is a modification algorithm that modifies the pulse height/pulse width profile of the pulse. The method conveniently further comprises using the pulse height and/or width after such modification for further processing.

Optionally, a class may be unmodified and thus the method comprises assigning a pulse to one of at least two classes that are the subject to different processing algorithms, at least one of which makes no modification such that the produced output pulse height/pulse width profile is thus unmodified. The method conveniently further comprises using the pulse height and/or width without modification for further processing.

Optionally the method comprises assigning a pulse to a larger plurality of classes that are subject to different processing algorithms before further use, at least one of which is a modification algorithm that modifies the pulse height/pulse width profile of the pulse.

The method of producing a pulse from the interaction in a detector will be familiar and for example comprises amplifying the signal from the detector and shaping the signal for example using a Gaussian pulse shaper or similar to produce a pulse.

A reference to a pulse where made herein is to be interpreted broadly as a reference to any energy signal produced by an interaction event in the detector that has the general characteristic of a pulse, in that there is an energy response that occurs over a finite period, for example in the form of an energy response that rises and falls over a finite period, for example reflecting a sweep out time No further limitation should be inferred unless made express. In particular no pulse shape or energy distribution should be inferred. In the same way, a reference to a measurement of or generation of a pulse where made herein is to be interpreted similarly as a reference to any measurement of or generation of relational data that relates an energy response to time. No particular data format need be inferred and in particular no display of a representation of a pulse is implied.

A reference to a pulse height measurement or to a pulse height where made herein is to be interpreted broadly as a reference to any measurement that is related to and representative of a pulse magnitude, in particular preferably in a systematic and for example functional manner. A pulse magnitude may be an energy magnitude and for example a voltage magnitude, but could be any data item representative of a property that relates systematically to a magnitude of a pulse event. A height may be a maximum value or a value related functionally to a maximum value or any other value that relates systematically to a magnitude of a pulse event. A pulse height may typically measured in volts and in proportion to the energy of the detected photon.

A reference to a pulse width measurement or to a pulse width where made herein is to be interpreted broadly as a reference to any measurement that is related to and representative of a pulse duration, and for example of a sweep out time, in particular preferably in a systematic and for example functional manner. A pulse duration may typically be a time period. A pulse duration may be determined in any systematic way, for example functionally related to the time period over which the signal is detected with reference to a threshold energy value such as a background value or a half maximum, and is for example a time above such a threshold, or may be derived in any other manner that relates systematically to a duration of a pulse event.

The determination of a pulse height and width according to such principles will be familiar. The invention lies in the use of the determined pulse height/pulse width to assign the pulse to one of a plurality of classes which are then differently treated for further processing.

In a preferred case of the method the data from a plurality and preferably a large plurality of pulses is used to generate a cumulative spectrum dataset from data from pulses assigned to at least some of the different classes. For example data is assigned to at least a first and a second class and data from a plurality of pulses is used to generate a cumulative spectrum dataset from data from pulses assigned to at least the first class and data from pulses assigned to the second class.

In a possible example case the spectrum is a pulse height spectrum generated from pulse heights subjected to a first algorithm from pulses assigned to the first class and pulse heights subjected to a second algorithm from pulses assigned to the second class. In a possible example case the spectrum is a pulse height spectrum generated from uncorrected pulse heights from pulses assigned to the first class and modified pulse heights from pulses assigned to the second class. Further classes may be defined and pulses assigned thereto subject to different modification.

For example, a pulse height spectrum comprises a stored histogram type dataset of cumulative pulse-heights at a plurality of pulse height values and the processing step comprises:

(a) if the event is assigned to a first class, adding a count to the pulse height spectrum based on the measured pulse height;

(b) if the event is assigned to a second class, applying a correction to modify the pulse height/pulse width profile of the pulse, and then adding a count to the pulse height spectrum based on the modified pulse height;

(c) optionally if the event is assigned to a third class, discarding the pulse.

One or more such first, second and third classes may be defined.

The method in this example case thus comprises at its broadest assigning pulses close to the ideal to a first class to be processed and for example to be used to update a stored pulse height spectrum without correction, and assigning at least some of the remainder to a second class where, rather than being discarded, they are subjected to a correction to modify the pulse height/pulse width profile of the pulse, and for example at least the pulse height, before being processed and for example used to update the pulse height spectrum. The method of the invention thus enables recovery of useful data from anomalous pulse events in the second class by applying an appropriate error correction.

It is recognised that in some cases, particularly at high count rates, some pulse events can be collected for which application of a correction is impractical. Accordingly, the embodiment of the invention encompasses the optional possibility of defining a third, discard class in addition to the first and second classes. If the pulse height/pulse width otherwise in compliance with (ii) above fails to meet an acceptance criterion it is assigned to class (iii). In particular, if the pulse height/pulse width falls outside a predetermined acceptance range of pulse height/pulse width.

An example of the invention is discussed below based on such a notional three class system in which some pulses are assigned to a first class and added to the stored pulse height spectrum unmodified, some are assigned to a second class and added to the stored pulse height spectrum modified, and some are assigned to a third class and discarded.

This is an example only. It is necessary for the invention only that some pulses are assigned to each of a plurality of classes which are subjected to different algorithms, for example before being added to the stored pulse height spectrum. Any number of classes may be envisaged. In particular any number of classes which are differently modified may be envisaged. The invention does not require that there is a class that is unmodified. The invention does not require that there is a class that is discarded. Provided that some pulses are assigned to at least two classes which are subjected to different algorithms the basic principle of the invention has been applied.

A pulse may be considered in terms of its position on a notional pulse height/pulse width plot/in a notional pulse height/pulse width space. On this basis a pulse is assigned to the first class if the pulse width/pulse height is within the threshold range of a first notional bounding condition of pulse height/pulse width values, the second class if the pulse width/pulse height is outside the threshold range but within the acceptance range, and the third class if the pulse height/pulse width is outside the acceptance range of pulse height/pulse width values.

Any pulse recorded as being below the threshold range is likely to be anomalous and is preferably discarded. Conveniently further, an acceptance range is set by applying a notional acceptance limit above the threshold range, for example comprising a second bounding condition on the notional pulse width/pulse height plot.

In this case the assignment phase of the method comprises:
assigning the pulse to one of three classes based on the determined pulse height/pulse width as follows;
(i) a first class if the pulse height/pulse width is within a threshold range of a first notional bounding condition of pulse height/pulse width values, for example expressed as a first bounding curve on a notional pulse height/pulse width plot;
(iii) a second class if the pulse height/pulse width is above the upper bound of the threshold range but below a second notional bounding condition of pulse height/pulse width values for example expressed as a second bounding curve on a notional pulse height/pulse width plot;
(iii) a third class if the pulse height/pulse width is otherwise than in compliance with (i) or (ii) above.

It is important to emphasise that references to a notional bounding condition on a notional pulse height/pulse width plot are to be seen as references only to the general principles which are embodied in defining the plural classes above described with reference to pulse height/pulse width. In accordance with the principles of the invention, pulses are divided into at least two classes which are subjected to different algorithms and preferably at least three classes as above which are subject to use unmodified, use modified, and discard, comprising in the latter case those within a threshold range of a first condition, those above the threshold range of a first condition but within the bounds of a second condition, and those outside both definitions.

In an alternative way of envisioning the same, used below for explanatory purposes, it might be seen that notional pulse height/pulse width space is divided into at least two and preferably at least three zones, comprising in the latter case those within a threshold range of a first bounding curve on a notional pulse height/pulse width plot, those above the threshold range of a first condition but below a second bounding curve on a notional pulse height/pulse width plot, and those outside both definitions. In this example case the two notional bounding curves thus "divide" pulse height/pulse width space into three "zones" corresponding to the three class definitions. Where more than three zones are defined more than two bounding curves will be used.

It is important to emphasise that such use is figurative. The invention does not require any plot of pulse height/pulse width as such to be made or any curve as such to be generated or any map of pulse height/pulse width space as such to be generated. It merely requires pulses to be assigned to classes according to such notional definitions.

In particular, the method may in many instances conveniently be implemented digitally via a lookup table or similar, with any notional curve or division of pulse height/pulse width space being similarly merely a matter of assigning each digitised pulse height/pulse width value to an appropriate class. The invention encompasses all such approaches and any figurative language used to define the classes should not be interpreted as going beyond that figurative intent.

As noted, pulses can be subject to a number of effects as a result of which the interaction event may be more or less fully collected. In addition to pulses that are substantially fully collected other pulses may be more poorly collected due to effects including without limitation depth of interaction effects within the detector, pulse pile up of very closely piled up pulses and ballistic deficit effects in the readout electronics etc. This will tend to produce a distribution of actual pulse height/pulse width readings on a pulse height/pulse width data plot that varies to a greater or lesser extent from an ideal case.

The method of the invention makes use of the distribution of a pulse height/pulse width readings on a pulse height/pulse width data plot. It relies on the application of a degree of discrimination on such a plot being identified between a pulse width/pulse height associated with pulses that have varied to a greater or lesser extent from an ideal cases and using this discrimination to assign pulses to plural classes for different processing to tend to make the accumulated spectrum more closely approximate to the ideal case. In the non-limiting three class example this discrimination sees pulses falling into the three distinct classes, corresponding to pulses collected after a broadly idealised interaction that can be used uncorrected, pulses subject to correctable effects, and pulses subject to such severe effects that they are best discarded. The invention should not be considered as limited to the numerical method by which these classes are defined.

Essentially fully collected (class 1) pulses lie in pulse width/pulse height space closely adjacent to a first bounding curve which represents a notional ideal pulse height/pulse width plot with no discernable depth of interaction effects. The method of the invention considers that pulses that fall within a narrow threshold range of this first bounding curve on a notional pulse height/pulse width plot may be treated as fully collected and the heights of such pulses assigned to a stored dataset without correction. In essence, in the assigning step of the method, a pulse is assigned to the first class if and only if its pulse height/pulse width measurement is closely approximating to and in particular substantially coincident with the idealised minimum pulse height/pulse width plot for notional ideal interaction with negligible depth effects. The threshold range is defined by an upper and lower bound at close approximation to the first bounding curve. The threshold range is much narrower in extent than the range between the first and second bounding curves. The threshold range is predetermined to represent in practice the range of measurements for which the pulse height/pulse width reading can be deemed sufficiently close to the notional minimum pulse height/pulse width plot to be assumed to be substantially free of depth interaction effects and to be further processed without correction.

Pulses subject primarily to depth interaction effects are found to lie in pulse height/pulse width space outside and above this narrow threshold range closely approximating to the notional ideal curve but within an area bounded by a second bounding curve and can thus be discriminated to large degree for correction before further processing.

Pulses outside either area in pulse height/pulse width space are discarded. In practice this refers to pulses above the second bounding curve on a notional pulse width/pulse height plot.

To some extent, these two classes can reflect a deviation from an ideal case attributable to different predominant mechanisms. Most pulse events that are poorly collected as a result of significant pulse pile up are found to lie in pulse width/pulse height space above this upper bounding curve and can thus be discriminated to large degree from pulses subject primarily to depth interaction effects.

It should be understood that the invention is not limited by such distinction. Real pulses will be subject to multiple effects including but not limited to those discussed and lie on a continuum away from the idealised case. Even so, to some degree the invention offers the possibility of discriminating to some extent between distorted pulses that can be corrected and added back and distorted pulses that are better discarded. An example implementation of a three class data process is discussed in this context below, but it must be understood that the invention is not limited by any requirement to infer or attribute any cause of less than ideal pulse collection.

Where this approach is used to build up a pulse height spectrum the treatment of each class of distorted pulse separately ensures that the majority of piled up pulses are not added back into the spectrum, well collected pulses are added into the spectrum uncorrected, and pulses subject to depth interaction effects are subject to a depth of interaction correction before being added back into the spectrum.

The method of the invention thus enables the distinguishing of pulses by criteria that correspond broadly to those exhibited by the three classes and thus make it possible to separate at least the first class from the rest, and preferably all the three classes of pulses, and separately process them, for example using the pulses from the first class to derive an uncorrected pulse height reading, applying a correction to the pulses in the second class to derive a corrected pulse height reading that mitigates depth of interaction effects such as ballistic deficit and incomplete charge collection, and where applicable discarding pulses from the third class. In practice the method is repeated for a large plurality of pulse events, to collect a large plurality of pulse height readings, both without correction when identified in the first class and subject to correction when identified in the second class to produce a more representative cumulative spectrum than would be obtained merely by discarding both piled up events and incompletely collected events.

Conveniently, the method of modification/correction of a pulse (the step of applying a modification/correction to modify the pulse height/pulse width profile of the pulse, and then adding a count based on the modified pulse height to a pulse height spectrum) comprises at least the step of assigning to a given measured pulse height/pulse width profile a modified pulse height reading, for example a modified pulse height or pulse width/pulse height profile, substituting such modified pulse height for the equivalent reading corresponding to or derivable from the measured pulse height, and using the substitute reading as the basis for updating and for example adding a count to the pulse height spectrum.

For example the method comprises applying a transfer function to a given measured pulse width/pulse height profile to derive therefrom a modified pulse height reading. Additionally or alternatively, a reference data register for example in the form of a lookup table may be provided in which a plurality of modified pulse heights are stored, each respectively linked to a corresponding measured pulse height/pulse width profile, and the method comprises the steps, at least for each class 2 signal, of reading the reference data register, obtaining therefrom the modified energy reading for a given measured pulse height/pulse width profile, and substituting such modified reading for the equivalent measured reading.

Where a reference data register for example in the form of a lookup table is used, it may also serve in the performance of the method steps for processing of class 1 and/or 3 signals. In the former case, the reference data register may be provided with measured pulse height/pulse width profiles respectively linked to corresponding unmodified pulse heights (that is, to corresponding unmodified heights derived directly from, and for example comprising, measured values). In the latter case the reference data register may be provided with measured pulse height/pulse width profiles respectively linked to a data item processed as a discard instruction, for example a null value.

In this case, the step of processing each pulse, whether in accordance with step a), b) or where applicable c) above, is conveniently performed by the steps of reading the reference data register, obtaining therefrom a corrected pulse height reading or discard instruction for a given measured pulse height/pulse width profile, and adding the count to the appropriate bin in the pulse height spectrum or discarding the pulse accordingly.

A pulse height is in a particularly preferred case a reading functionally representative of a pulse energy, and for example a peak pulse height. In such a case the method of correction of class 2 signals comprises at least the step of substituting a modified pulse height for the measured pulse height, obtaining a modified height, and using the modified pulse height to update the pulse height spectrum.

It is not desirable merely to use fully collected pulses, particularly for an $I/I_0$ or like data analysis, and particularly at high count rate. Simple removal of incompletely collected events would not only reduce the throughput of counts but would also result in a filter which does not apply uniformly to the entire spectrum. This is due to the higher energy photons having a greater average penetration depth resulting in a larger depth of interaction effect when compared with lower energy photons. For this reason an energy correction method is desirable in order to reassign pulses to the correct energy bins.

In order to reassign those pulses which are primarily affected by depth of interaction effects it is preferable for them to be distinguished from those which have larger than expected base widths due to pulse pile up. It is not desirable to reassign a piled up pulse back into the spectrum as both the energy and number of such pulses cannot be accurately determined. The treatment of each class of distorted pulse separately ensures that piled up pulses occurring outside of the class 2 region of the height/width plot are not added back into the spectrum. Examples of the invention discussed below include a step to make this distinction. However, the invention also encompasses applying an energy correction method to pulses in the class 2 region and is desirable in order to reassign pulses to the correct energy bins. Such a correction method offers advantages over a method that simply discards all imperfectly collected events, especially in cases where the pulse pile up contribution is relatively small (for example, at lower count rates) or where depth of interaction effects are pronounced (for example, in thick detectors).

In the preferred case, the method of applying a depth of interaction correction to a pulse assigned to class 2 comprises the step of applying a correction to the measured pulse height/pulse width profile of the pulse to produce a modified pulse height/pulse width profile that more closely approaches, and in the ideal case essentially corresponds to, the notional ideal pulse height/pulse width on the ideal minimum pulse height/pulse width curve. In particular, at least a modified pulse height is produced that more closely approaches, and in the ideal case essentially corresponds to, the notional ideal pulse height for a given measured pulse height/pulse width profile. That is to say, the correction step comprises mapping a pulse assigned to class 2 back towards (and in the ideal case back onto) the appropriate corresponding point on the ideal minimum pulse height/pulse width curve, at least as regards the pulse height measurement.

Again, references herein to mapping a pulse back onto the appropriate corresponding point on the ideal pulse height/pulse width curve should be taken as illustrative of the principle and not specifically limiting of the method. The invention does not require the generation of such an ideal pulse height/pulse width curve or of any mapping function. The principles of the invention apply to any analogue or digital processing method whereby a modified pulse height is produced that more closely approaches, and in the ideal case essentially corresponds to, the notional ideal pulse height.

A modified pulse height reading, for example comprising at least a reading related to a modified pulse height, is then stored for each pulse assigned to class 2.

Since the deviation of measured pulse width and pulse height from ideal are functionally related where attributable to depth of interaction effects, it would be possible to produce a modified pulse height/pulse width pair value, but this is not necessary to perform the invention in the case where data to be recorded is a spectrum of pulse heights.

Although language has been used hereinabove which treats the pulse height/pulse width space as a continuum, the skilled person will readily appreciate that the same principles apply to a digitised approach. It is likely in a preferred application of the method that the pulse height/pulse width space be notionally divided discretely and digitally into plural areas with finite height and width range each assigned a notional discrete value. The pulse is typically digitised by an analogue to digital (A to D) converter and the discrete values of pulse width and pulse height relate to the sampling frequency and number of bits in the A to D converter. References to the first bounding curve and the second bounding curve will be interpreted accordingly as being references to series of such discrete values lying on and together defining a notional curve in pulse width/pulse height space.

In a particular refinement of the method of correction of class 2 signals based on such a digital analysis:
each pulse height/pulse width pair value corresponding to a measured pulse event signal determined to be within the class 2 region is assigned to a single modified (and preferably notionally ideal) pulse height reading, for example a single modified (and preferably notionally ideal) pulse height or pulse height/pulse width pair of values;
the step of applying a depth of interaction correction to an event assigned to class 2 comprises substituting such modified pulse energy reading and for example modified pulse height for the equivalent measured value, and
using the substitute value to update a cumulative spectrum. The assigned pulse height/pulse width pair value is thus the modified pulse height of the basic method (i.e. standard pulse height spectroscopy).

In a typical case, the pulse height/pulse width plot is a voltage/time above threshold scatter plot. The pulse height is measured with reference to the voltage axis, and is for example a pulse voltage difference over a reference voltage or an absolute pulse voltage. The pulse width is measured with reference to the time axis, and is for example the period a pulse voltage exceeds a reference voltage.

The pulse height is suitably determined with reference to a peak pulse value for the pulse. The pulse height is conveniently defined as the peak pulse value which is typically a peak voltage. This may be the peak pulse value above zero or above an alternative threshold value.

The pulse width is determined as the time interval during which the pulse satisfies a particular condition, for example being the time interval during which the pulse value is above a threshold value and for example during which the voltage is above a threshold voltage. The threshold value may be the same for all pulses, for example being predetermined, or may be set with reference to the pulse height, for example as a fraction of the peak height. In accordance with the method of the invention, setting a single predetermined threshold value will often be preferred.

The pulse energy reading added to a cumulative spectrum dataset is typically derived from a pulse height, and for example a peak pulse value as above described. For example the pulse energy reading is derived from a peak voltage. The pulse energy reading is related to such a pulse height via a suitable functional relationship, subject to the additional correction in the case of each pulse determined to be in the second class and without being subject to the additional correction in the case of each pulse energy reading determined to be in the first class.

The method of the invention determines a pair of bounding values (comprising curves on a notional pulse width/pulse height plot) which together divide a pulse width/pulse height space into three regions. A first, substantially at the lower bounding value, corresponds to pulses which are generally fully collected without undesirable interaction effects. The second, between the two bounding values, consists primarily of pulses which are not subject to serious pulse pile up but which exhibit depth of interaction effects. The third, above the upper bounding value, consists primarily of pulses which are subject to pulse pile up only.

In a convenient embodiment for performance of the method of the invention, the method comprises provision of and/or determination of such an ideal minimum pulse width/pulse height curve appropriate to a system and/or material for which data is to be collected, for example from a suitable data library and or by experimentation. This ideal minimum pulse width/pulse height curve comprises the said first bounding curve on a notional pulse width/pulse height plot. The said second bounding curve on a notional pulse width/pulse height plot may be derived similarly, or may be derived with reference to the first bounding curve, for example numerically there from.

In a preferred modification of the method, the cumulative dead time from each discarded pulse is counted by adding the width of each such pulse to a dead time counter. This information can then be used to make a dead time correction to the measurement if desired.

In accordance with the invention in a further aspect, a method of detection of radiation comprises the steps of:
causing radiation to impinge on a face of the semiconductor detector device, for example directly from a radiation source or after an interaction with an object, for example comprising transmission, scattering, backscattering, absorption etc;
measuring a pulse and in the preferred case a plurality of pulses from radiation incident at the semiconductor device;
applying the method of the first aspect of the invention to process the said pulses.

Preferred features of this aspect will be understood by analogy with the first aspect.

In accordance with the invention in a further aspect, a device for the detection of radiation is described operable on the principles of the method above described.

Thus, the device for example comprises:
a semiconductor radiation detector;
a pulse event detection module to detect an event at the detector, for example by sampling the response of the detector, and generate a pulse with a pulse height measurement representative of pulse magnitude and a a pulse width measurement representative of pulse duration;
a data processing module adapted to analyse the pulse height/pulse width for each pulse; assign each pulse to one of at least two classes based on the determined pulse height/pulse width; and apply to each pulse an algorithm specific to its particular class to produce an output pulse height/pulse width profile.

Thus, the device in a more specific example embodiment comprises:
a semiconductor radiation detector;
a pulse event detection module to detect an event at the detector, for example by sampling the response of the detector, and generate a pulse with a pulse height measurement representative of pulse magnitude and a a pulse width measurement representative of pulse duration;
a data processing module adapted to analyse the pulse height/pulse width for each pulse and there from assign each pulse to one of three classes based on a pulse width/pulse height reading and to process each such pulse as follows:
(i) if the pulse height/pulse width is within a threshold range of a first notional bounding condition of pulse height/pulse width values, for example expressed as a first bounding curve on a notional pulse width/pulse height plot, apply a first algorithm to produce an output pulse height and/or width, which may optionally be an input pulse height and/or width without further correction, for further processing;
(ii) if the a pulse height/pulse width is between the threshold range of the first notional bounding condition/first bounding curve and a second notional bounding condition of pulse height/pulse width values, for example expressed as a second bounding curve, apply a second algorithm to produce an output pulse height and/or width and for example to modify the pulse height/pulse width profile of the pulse, and then output the pulse height and/or width so produced for further processing;
(iii) optionally, if a pulse height/pulse width fails to meet an acceptance criterion and for example is outside of the second bounding curve, discard the pulse.

The device comprises a pulse event detection module to detect an event at the detector, for example by sampling the response of the detector, and generate a pulse as above defined, for example with a pulse height as above defined which is related to the collected signal from the detector. A pulse width measurement device for example including a clock determines a pulse width as above defined.

The device preferably implements the above method. In particular the data processing module is adapted to provide that at least one algorithm applied to at least one class modifies the pulse height/pulse width profile of a pulse assigned to that class and outputs the pulse height and/or width so modified for further processing.

Optionally, at least one algorithm may make no modification. The produced output pulse height/pulse width profile is thus unmodified, and the processing module is adapted to provide that at least one algorithm applied to at least one class outputs the pulse height and/or width without modification for further processing.

In the more specific example case the processing module provides that in case (i) the pulse height and/or width is passed without further correction for further processing; and in case (ii) the pulse height/pulse width profile of the pulse is modified and height and/or width so modified is passed for further processing.

The device may further comprise a data storage module to store pulse height readings and/or data derived therefrom.

The data storage module may be adapted to store data derived from a large plurality of pulses as a cumulative spectrum dataset derived from pulses assigned to at least some of the classes.

The spectrum may be a pulse height spectrum generated from pulse heights subjected to a first algorithm from pulses assigned to a first class and pulse heights subjected to a second algorithm from pulses assigned to a second class.

The spectrum may be a pulse height spectrum generated from uncorrected pulse heights from pulses assigned to the first class and modified pulse heights from pulses assigned to the second class.

For example the data storage module may be adapted to store data derived from a large plurality of pulses as a cumulative spectrum dataset from uncorrected data from pulses assigned to the first class and corrected data from pulses assigned to the second class.

The spectrum may be a pulse height spectrum generated from uncorrected pulse heights from pulses assigned to the first class and corrected pulse heights from pulses assigned to the second class.

The data processing module may be adapted to perform suitable steps of the method of the first aspect and preferred steps will be understood by analogy.

Conveniently in particular, the data processing module is adapted to perform function (ii) by assigning to a given measured pulse height/pulse width profile a modified pulse height, for example a modified pulse height or pulse width/pulse height profile, substituting such a modified pulse height for the equivalent measured value, and using the substitute value to update the stored dataset.

For example in particular the data processing module is adapted to apply a transfer function to a given measured pulse height/pulse width profile to derive there from a modified pulse height reading. Additionally or alternatively, a reference data register may be provided in which a plurality of modified pulse heights and widths are stored, each respectively linked to a corresponding measured pulse height/pulse width profile, and the data processing module is adapted to read the reference data register, obtain there from the modified pulse height reading for a given measured pulse height/pulse width profile, and substitute such modified pulse height and/or width reading for the equivalent measured value. In the latter case, the reference data register may additionally store unmodified pulse energy readings and/or discard instructions in respect of class 1 and/or class 3 pulses, and may be addressable in the manner above described with reference to the method.

Preferably, the apparatus is adapted to determine a pulse height with reference to a peak pulse value for the pulse and a pulse width with reference to the time interval during which the pulse satisfies a particular threshold condition as above described. The apparatus may include means to set a predetermined threshold in a suitable reference data register.

The pulse height reading used for further processing, for example in the specific embodiment to update a stored spectrum dataset, is typically derived from a measured pulse height, and for example a peak pulse value as above described with reference to the method.

The apparatus is able to select between pulses which are generally fully collected without undesirable interaction effects, and which are then added to the data store without applying the transfer function, pulses which are subject to pulse pile up, and which are discarded, and pulses which exhibit depth of interaction effects and/or contain very closely piled up pulses, and which are collected but first subject to the transfer function. The resultant dataset more closely matches the underlying conditions and corrects for undesirable effects of depth of interaction and a significant fraction of pulse pile up.

In a preferred modification, the apparatus has a dead time counter and is adapted to record the cumulative dead time from each discarded pulse by adding the width of each such pulse to the dead time counter. This information can then be used to make a dead time correction to the measurement if desired.

Other preferred apparatus features will be understood by analogy to the description of the method herein.

Preferably, acquired energy data is resolved in an energy selective manner at a plurality of energies and/or across a plurality of energy bands. Preferably the pulse energy data register comprises a plurality of energy selective bins and each pulse is selectively stored in one of such bins according to the height of the pulse.

The process of collecting or discarding pulses is repeated until a representative large plurality of pulses has been acquired in the pulse energy data register, in particular in spectrally resolved manner as an energy spectrum dataset.

The resultant corrected energy spectrum dataset may be stored or output to another device for further processing.

The semiconductor material comprising the device is preferably a material adapted for high energy physics applications, such as a material able to act as a detector for high energy radiation, and for example high energy electromagnetic radiation such as x-rays or gamma rays, or subatomic particle radiation. The resultant device comprises at least one layer of such material and is thus a device adapted for high energy physics applications, and for example a detector for high energy radiation such as x-rays or gamma rays, or subatomic particle radiation.

The semiconductor device is preferably a detector device adapted to exhibit a spectroscopically variable response across at least a substantial part of the radiation spectrum in use. In particular the semiconductor material is used that exhibits inherently as a direct material property a direct variable electrical and for example photoelectric response to different parts of the radiation spectrum in use.

In a preferred embodiment the semiconductor material is formed as a bulk crystal, and for example as a bulk single crystal (where bulk crystal in this context indicates a thickness of at least 500 µm, and preferably of at least 1 mm).

In a preferred embodiment the semiconductor material may be selected from Group II-VI semiconductors and in particular may be selected from cadmium telluride, cadmium zinc telluride (CZT), cadmium manganese telluride (CMT), and alloys thereof, and for example, save for incidental impurities, consists essentially of crystalline $Cd_{1-(a+b)}Mn_aZn_bTe$ where $a+b<1$ and a and/or b may be zero. A composite device may also have other detector elements of other materials for additional functionality.

Similarly a radiation source may be a single broad spectrum source across which a plurality of bandwidths or single energies may be identified. Alternatively or additionally sources may be provided having narrow bandwidths or generating incident radiation at one or more discrete energies to provide some of the energies for comparison in accordance with the method of the invention. In this case the radiation source is a plural source comprising a combination of sources at different energies to provide the necessary total spectrum spread to allow resolution by the detector across a plurality of energies/energy bands.

For example a plural source comprises an x-ray source having a continuous Bremsstrahlung spectrum for example from 0 to 160 keV or a radioisotope with discrete emission lines, for example $^{57}Co$ with emission lines at 14 keV, 122 keV and 136 keV.

The source is preferably capable of generating a sufficiently broad spectrum of radiation to enable the spectral resolution necessary for the performance of the invention. Preferably the source generates radiation across at least one or more parts of the range of 20 keV to 1 MeV, and more preferably across at least a part, and for example a major part, of the range of 20 keV to 160 keV. For example the source generates radiation ranging across at least one bandwidth of at least 20 keV within the given range. For example the spectrum is such that at least three 10 keV bands can be resolved within that range.

It will be understood generally that a numerical or other data processing step in the method of the invention can be implemented by a suitable set of machine readable instructions or code. These machine readable instructions may be loaded onto a general purpose computer, special purpose computer, or other programmable data processing apparatus to produce a means for implementing the step specified. For example, the signal from the detector and associated electronics may be converted into an energy spectrum by a Field Programmable Gate Array (FPGA).

These machine readable instructions may also be stored in a computer readable medium that can direct a computer or other programmable data processing apparatus to function in a particular manner, such that the instructions stored in a computer readable medium produce an article of manufacture including instruction means to implement some or all of the numerical steps in the method of the invention. Computer program instructions may also be loaded onto a computer or other programmable apparatus to produce a machine capable of implementing a computer executed process such that the instructions are executed on the computer or other programmable apparatus providing steps for implementing some or all of the data processing steps in the method of the invention. It will be understood that a step can be implemented by, and a means of the apparatus for performing such a step composed in, any suitable combinations of special purpose hardware and/or computer instructions.

BRIEF DESCRIPTION OF THE DRAWINGS

The invention will now be described by way of example only with reference to FIGS. 1 to 9 in which.

DETAILED DESCRIPTION

In accordance with an example embodiment of the invention, a method has been developed which enables excellent spectral resolution to be achieved from planar CdTe/CdZnTe detectors. This is particularly useful for high count rate and high energy applications where there are significant signals both in the "lozenge" described below and elsewhere on the height/width plot due to pile up. It is also potentially particularly useful for high energy applications with very thick detectors (not necessarily at high count rate. In such cases there is a large "lozenge" whether or not there are large numbers of piled up pulses. The method works by removing events in which the hole signal is only partially read out. These events are then energy corrected by the algorithm and added back into the spectrum enabling both resolution and count rate to be preserved.

Figure 1:
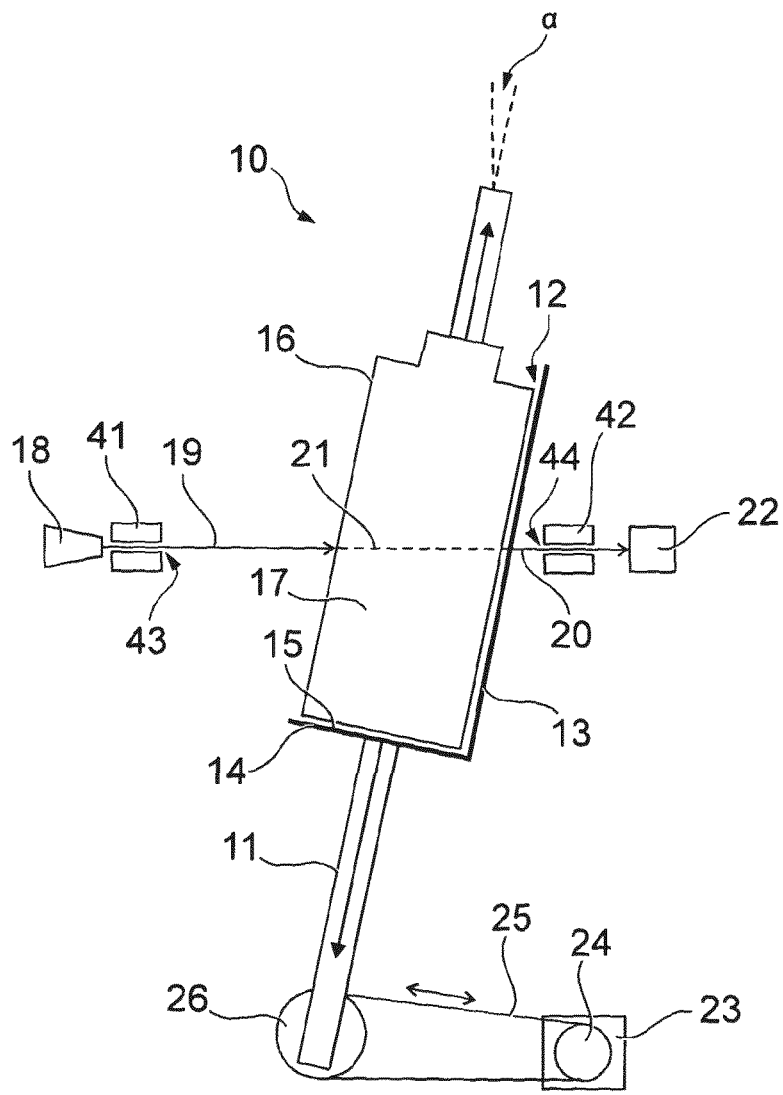
FIG. 1 is a schematic representation of an apparatus to which the invention could be applied.

FIG. 1 illustrates an embodiment of a possible apparatus on which the invention can be implemented. FIG. 1 shows a bottle scanner for scanning liquids in bottles and like objects using x-ray radiation.

The bottle scanner 10 is provided with a linear slider shaft 11 to move a bottle holder 12 that is fixedly connected to the linear slider shaft 11 for movement therewith. The linear slider shaft 11 is capable of moving the bottle holder 12 in two directions.

The bottle holder 12 comprises a back member 13 against which the bottle 16 rests and a base member 14 with a top surface 15 onto which the bottle 16 sits. The bottle 16 is nested against and into the bottle holder 12 by virtue of the holder and linear slider shaft being inclined at an angle $\alpha$.

In the example this might be an angle of 15° from vertical. For a bottle, an angle of between 5° and 30° might be convenient. Other shapes of objects or containers might be held at different optimum angles.

The bottle holder back member 13 is preferably provided with an opening (not shown) to allow a clear path for the x-ray beam to pass from the bottle to the detector. The opening in the back member 13 could be a slot shaped aperture running from the top to the bottom of the back member. The slot aperture could be a narrow slot that provides some beam collimation with a width sufficient to allow the beam to pass through unimpeded but narrow enough to restrict any scatter radiation from reaching the detector 22. Additional or other alternative collimation of the beam on the transmission side could be provided.

The movement of the bottle holder 12 and bottle 16 along the linear slider shaft 11 is caused by the rotation of the electrically powered stepper motor 23. The motor causes the pulley 24 to rotate, which drives belt 25 which, in turn, drives the rotation of pulley 26. The rotational motion of pulley 26 is converted into a rotation of a suitable drive such as a screw drive (not shown) in the linear slider shaft 11 which creates the linear motion of the bottle holder 12.

The motor is capable of rotation in either direction and by controlling the direction of rotation of the motor the direction of movement of the bottle holder 12 and bottle 16 can be determined.

As the bottle is moved along the direction of the linear slider shaft it is caused to pass through an x-ray beam 19. The incident beam 19 is generated by a source 18.

The x-ray beam 19 is aligned horizontally. The bottle may be vertical. Alternatively it may be inclined at an angle $\alpha$ from the vertical so that the beam does not strike the bottle perpendicular to the bottle's surface. This arrangement gives an increased absorption path for the beam as it passes through the bottle and its contents.

The incident beam 19 passes through the bottle 16 and bottle contents 17 where absorption and scatter will take place along beam path 21 before the transmission beam 22 emerges from the bottle and is detected by detector 20.

The x-ray beam in the embodiment is collimated by primary collimator 41 provided with aperture 43 and positioned close to the source 18 and is preferably a pencil beam with one dimensional geometry.

The transmission x-ray beam 20 in the embodiment is collimated through an appropriate aperture 44 in secondary collimator 42 before it arrives at detector 22.

In a possible mode of operation the bottle is placed in a cradle and the z position is automatically adjusted in order ensure the liquid intersects with the x-ray beam. The transmitted x-ray beam is then measured by the detector. The bottle is then moved out of the beam by the cradle and an Io measurement is taken. This process takes around 12 seconds with a pass or fail message returned to the user within 20 seconds. The detector 22 in generates a signal representative of the intensity and energy of interactions with photons from the transmission x-ray beam 20. These signals are then processed as detailed in FIG. 2 below.

The detector selected for the example embodiment is a 5×5×1 mm CdTe detector diode detector. In this example the detector is irradiated with a $Co^{57}$ source. In the embodiment the detector thus comprises material capable of spectroscopic resolution of incident x-rays, and in the specific example comprises cadmium telluride (CdTe) although it will be appreciated that alternative materials could be used.

Figure 2:
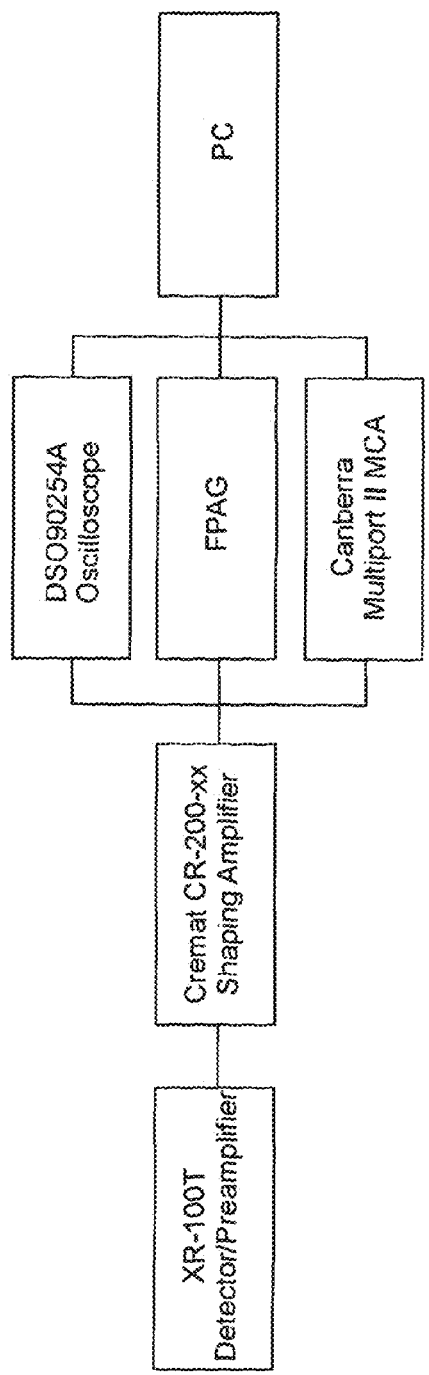
FIG. 2 is a general schematic of a possible system to implement an embodiment of the invention using the output of an apparatus such as that of FIG. 1.

The signal from the detector is read out by a preamplifier. The preamplifier is a charge sensitive preamplifier with current divider feedback. The signal passes to a shaping amplifier and is converted into an energy spectrum by the Field Programmable Gate Array (FPGA). It will be appreciated that each component in the schematic of FIG. 2 is merely an example of a suitable element by means of which the inherent resolution of a suitable detector may be converted into an energy spectrum which could be used individually or collectively with other suitable component.

A suitable algorithm to effect the method of the invention is conveniently implemented using a Field Programmable Gate Array (FPGA) and is capable of real time processing at high input count rates typical in an x-ray application.

Figure 3:
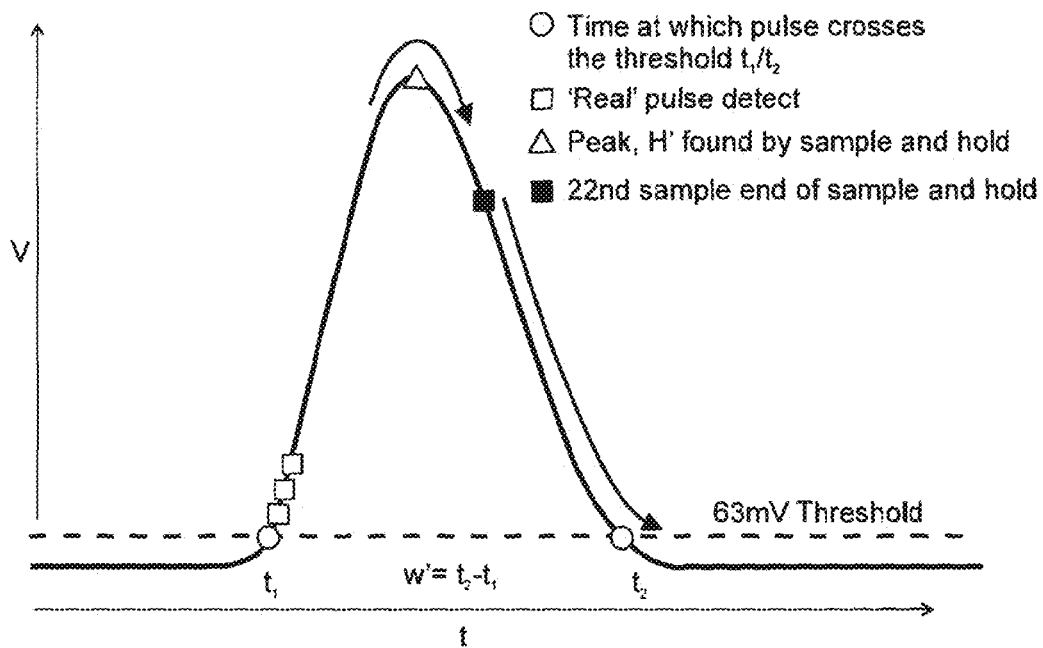
FIG. 3 is a graphical illustration of a pulse event collection.

The algorithm operates by filtering shaping amplifier pulses based on two parameters, the pulse height and width, where the pulse width is defined by the time above a predefined threshold voltage which is in the embodiment set at 63 mV. This is shown in FIG. 3.

As noted, pulses can be divided into three general classes:
Class 1: fully collected pulses;
Class 2: poorly collected pulses due to depth of interaction effects within the detector or very closely spaced piled up pulses;
Class 3: piled up pulses.

The algorithm that underlies the invention bins Class 1 pulses into a pulse height spectrum without specific novel modification, for example by a method similar to a standard MCA. Class 2 pulses are identified and undergo a depth of interaction correction and are then binned into the pulse height spectrum. Class 3 pulses are discarded.

Correction and binning of class 2 pulses is desirable as simple removal of these events would not only reduce the throughput of counts but would also result in a filter which does not apply uniformly to the entire spectrum. The mean interaction distance from the anode is dependent on the photon energy and would therefore result in preferential discarding of high energy events. In addition to this both I and $I_0$ spectra would be affected in different ways due to the variation in x-ray beam hardening. For this reason an energy correction method must be applied in order to reassign pulses to the correct energy bins. This correction of Class 2 pulses is an essential feature of the invention.

As the detector is a planar device, the signal is composed of the induced charge from both electrons and holes. The mobility of holes is typically around 10 times lower than that of electrons resulting in sweepout times which are limited by the velocity of the hole charge. This sets a lower limit on the collection time (shaping time in the case of a shaping amplifier) of the amplifier above which depth interaction effects will become significant.

An event subject to this effect implies that the photon interaction position, z, from the cathode is greater than the distance which can be traversed by the holes during the peaking time of the shaping amplifier. This gives a maximum interaction depth, z*, measured from the cathode contact on the detector.

Figure 4:
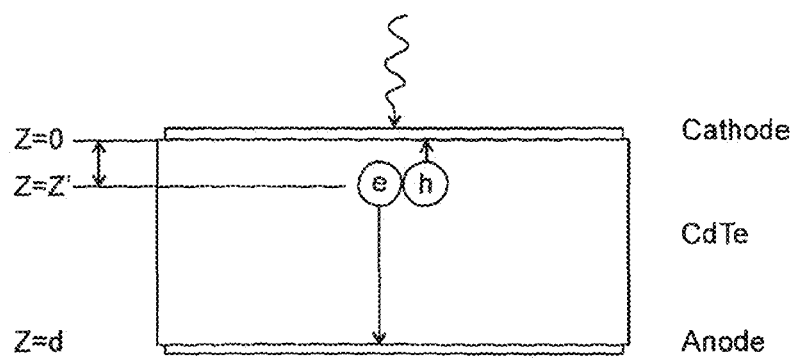
FIG. 4 is a diagram showing the creation of an electron-hole pair at a distance z* from the cathode.

Assuming the performance of the detector is limited only by the sweepout time of the charges and not by charge collection efficiency, interactions between z=0 and z=z* will result in collection of the entire electron and hole signal within $t_p$. Interactions between z=z* and z=d will result in some loss in hole signal. This is illustrated in FIG. 4. FIG. 4 shows the creation of an electron-hole pair at a distance z* from the cathode. Interactions at z>z* suffer ballistic deficit effects due to the longer collection time of the hole signal.

The maximum interaction depth z*, with respect to the cathode can be written in terms of the hole velocity and the peaking time of the shaping amplifier:

$$z^* = v_h t_p$$

The expression above therefore states that any interaction at a depth of greater than z* will not be fully collected in time $t_p$. Rewriting the above in terms of hole mobility shows the bias dependence of the maximum interaction position.

$$z^* = (\mu_h V/d) t_p$$

Higher bias voltages result in a larger value of z* due to the greater hole velocity. However bias voltage is limited by leakage current and in this example by the breakdown of the Schottky diode.

Like ballistic deficit, charge trapping results in loss of pulse height/energy proportionality as the probability of charge trapping increases with the path length that the electron and hole signals must traverse in order to reach the contacts. For this reason distortion of the pulse height due to ballistic deficit and charge trapping effects are convoluted and collectively contribute to form the continuum of pulse height distortion which leads to the tailing effect observed by standard pulse height analysis techniques.

It is desirable to use not only events with interactions at a depth of less than z* but also those subject to depth interaction effects. It will be shown that such effects can be corrected for.

In order to reassign those pulses which have distorted pulse heights/widths due to depth of interaction effects they must first be distinguished from those which have larger distorted base widths due to pulse pile up. It is not desirable to reassign a piled up pulse back into the spectrum as clearly both the energy and number of such pulses cannot be accurately determined.

The essence of the distinction method lies in an exploitation of the fact that class 2 and class 3 pulses tend to for the most part lie differently on Height-Width (HW) scatter plots. The treatment of each class of distorted pulse separately ensures that piled up pulses are not added back into the spectrum. This is shown by the data below.

Suitable HW acquisition software was used to produce the HW plots discussed in this section. The events are captured by the oscilloscope set to a sampling frequency of 200 MHz with a trigger level of 63 mV. The software contains a sample and hold stage to measure the maximum height of the pulse along with a timer to measure the time above the threshold. The output from this program is the H and W parameters for each pulse which can then used to form a HW scatter plot. In order to achieve reasonable counting statistics 100,000 events were collected for all experimental data shown here.

Figure 5:
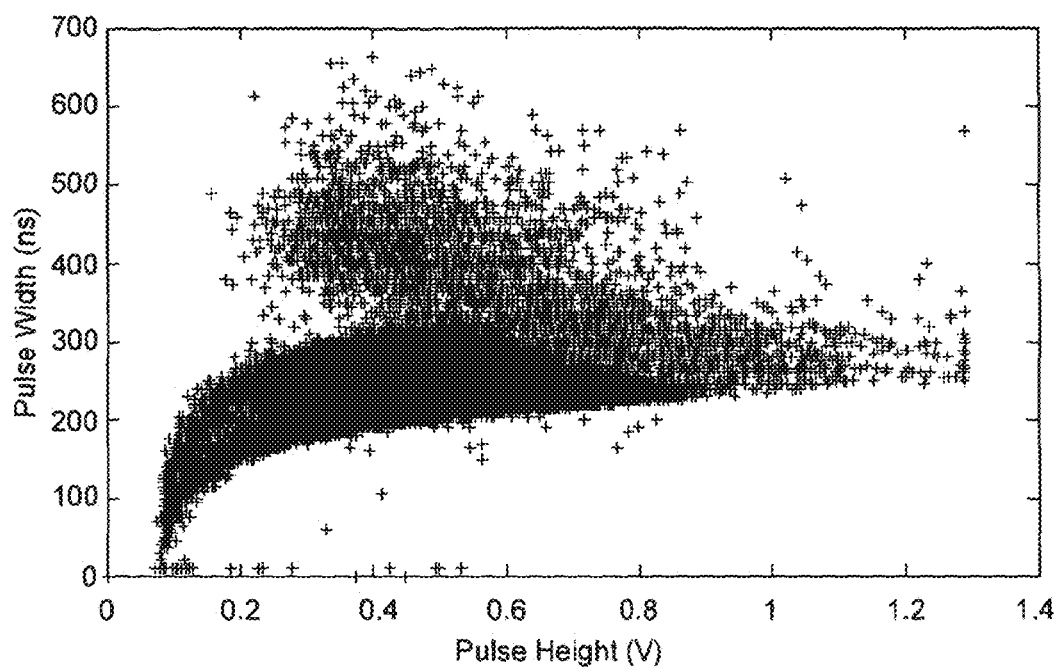
FIG. 5 is a graphical illustration of uncorrected pulse height and pulse width data at a practical count rate.

FIG. 5 shows a HW scatter plot from illumination with 0 to 160 keV x-rays from the Bremsstrahlung spectrum emitted by the x-ray generator. Here the detector bias was 600V and the shaping time was 50 ns. From FIG. 5 it can be seen that the lower edge of the plot represents the minimum width for a pulse of a given height and refers to the ideal case. Pulses lying along this line or very close to it have HW relationships which indicate complete collection of both the electron and hole signal i.e. interactions within a depth of less than z* (class 1 pulses). This depth sets the threshold range within which an interaction signal can be seen as essentially unaffected by depth of interaction effects attributable to lower hole mobility.

Above this region there are two further classes of pulses. The first, lying just above the minimum HW curve are pulses generated from interactions at positions greater than z*. The density of this the region arises from the fact that there is a unique relationship between the width and height of such pulses i.e. pulses with greater than minimum widths will have less than minimum heights in a correlated form. The region forms a lozenge shape. The parameters of this lozenge shape may be determined by a Monte Carlo simulation or by experiment using a low count rate source with the appropriate energy spectrum for example a 0 to 160 keV x-ray spectrum from a tungsten x-ray tube.

The region beyond this lozenge shape is less densely populated and arises from pulse pile up. Such piled up pulses have incorrect heights and widths which arise from the interaction of two pulses in a way that is completely random. The height and width of such pulses are completely uncorrelated. Consequently the scatter in this region is random and density fluctuations are expected to obey Poisson statistics.

Figure 6:
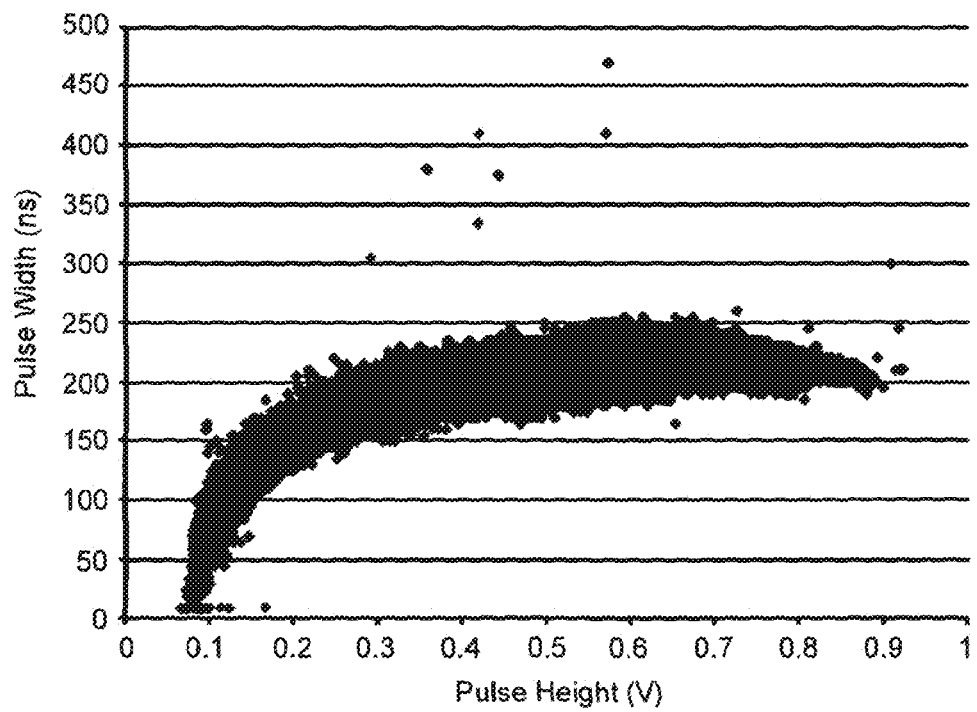
FIG. 6 is a graphical illustration of uncorrected pulse height and pulse width data at a lower count rate.

Proof that the deviations from the minimum HW curve in these two regions are due to differing mechanisms can be seen by repeating the measurement at a lower input count rate. This was done by using a $Co^{57}$ source. Such an experiment shows the lozenge shape remains, but that the outlying scatter is much diminished. This is shown in FIG. 6. By contrast, modelling of pulse pile up suggests a significant number of such signals exhibit a large deviation from the minimum HW curve and a substantial absence of counts in this lozenge region.

The large deviation from the minimum HW curve arises from the low probability of piled up pulses interacting in close enough succession to produce a pulse within the lozenge region of the HW plot. Conversely pulses which are affected by ballistic deficit and/or poor hole collection show only minor deviations in H and W.

This result is important as it allows the pulse pile up and depth of interaction regions to be largely distinguished in HW space making it possible to both remove the majority of piled up events and carry out a depth of interaction correction on the remaining events inside the lozenge region.

Although the invention is not limited by any need to characterise the particular mechanism by which a pulse might be imperfectly corrected, it is suggested that to some extent pulses can now be categorised into the following three classes:

Class 1 pulses which have both heights and widths which conform to the theoretical minimum from the CR-RC model of the shaping amplifier.

Class 2 pulses where the height and width of the pulse is distorted by correctible effects such as for example primarily by depth of interaction or ballistic deficit effects.

Class 3 pulses where the height and width of the pulse is distorted to too great an extent to be readily corrected and for example where significant pulse pile up effects predominate.

Figure 7:
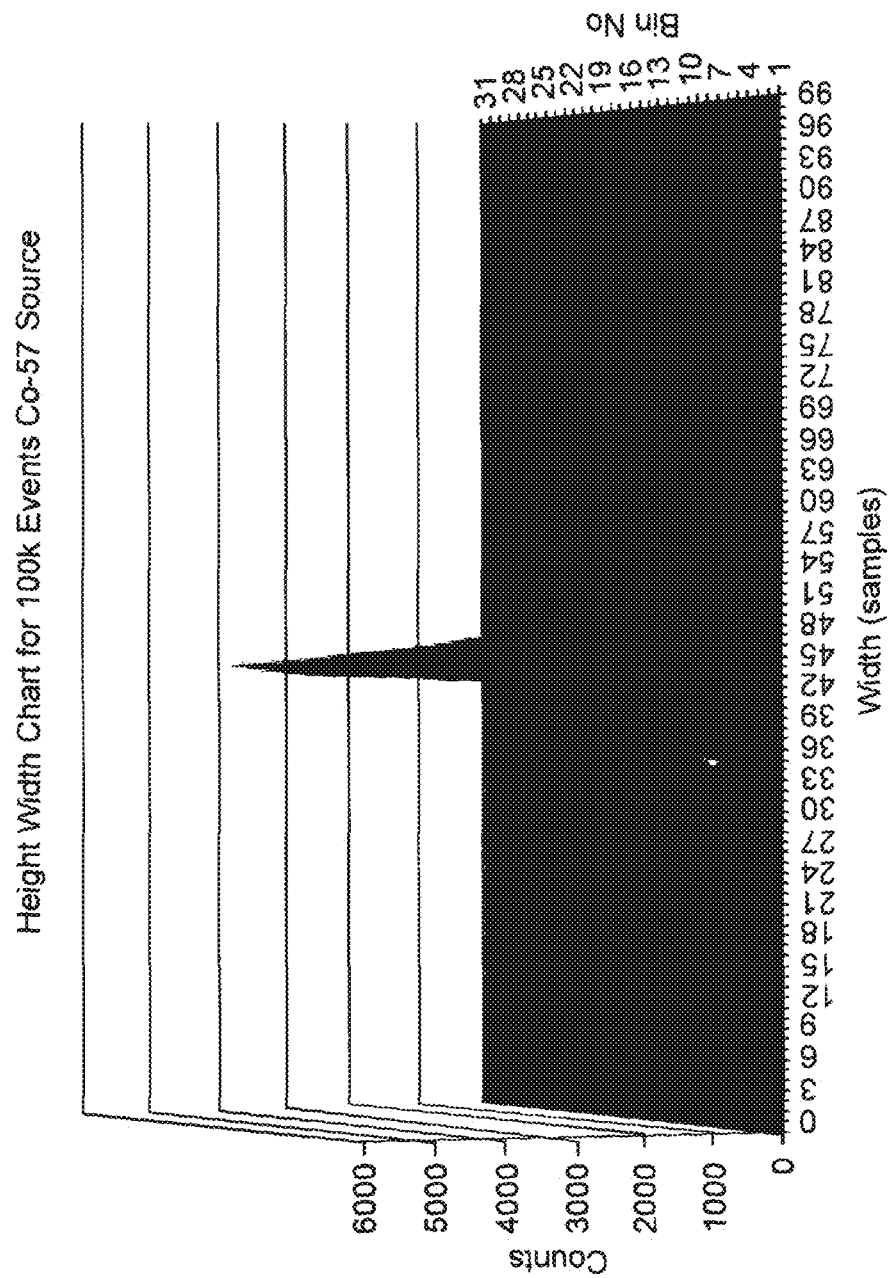
FIG. 7 is a three-dimensional representation of the data of FIG. 5.

The correlation of pulse width and pulse height in the case of class 2 pulses then allows a correction method to be applied in order to map back pulses onto the minimum HW curve. The HW correlation can be seen more clearly by plotting in three dimensions. FIG. 7 shows a HW plot of 100,000 events from a Co-57 source from FIG. 6 with a third axis expressing the number of events within a particular HW range.

As can be seen from FIG. 7 the 122 keV peak shows a tail which relates to events of greater width and reduced height. These are clearly 122 keV events which in normal pulse height spectroscopy would be wrongly assigned to a low bin, thus creating the familiar low energy tailing effect.

Taking the gradient of the tail of the 122 keV peak the incorrectly assigned pulses can be mapped back onto the minimum HW curve. This is done by calculating the true height, H for a pulse of measured width and height H', W' (see FIG. 3) respectively.

The basic pulse detect algorithm is described with reference to FIG. 3. In addition to the measurement of the pulse height, H', the base width, W', may be calculated by measuring the crossing time of the threshold by the pulse. Note that here the pulse widths and heights are referred to as H' and W' respectively as this reflects the possibility that the measured heights and widths of the pulses may differ from the corrected heights and widths H, W.

The pulse detect state is not re enabled until the pulse has dropped below the threshold level and therefore prevents the registering of any secondary pulses which are convoluted with the first pulse. The values of H' and W' are then returned by the algorithm.

A lookup table is used to assign pulses to bins accordingly. Locations in the lookup table are addressed by the measured pulse height and width H' and W' respectively. These are used to index the true height of the pulse from the lookup table. The look up table maps H'W' space discretely and two dimensionally into a plurality of areas each assigned an H value.

Locations in the lookup table which correspond to a Class 1 pulse contain a bin value which is equivalent to the height of the pulse. That is, in the case where H'=H the value in the lookup table at location (H'W') is the same as H'. This corresponds to the ideal case of the minimum HW curve (that is, to pulses in class 1, essentially fully collected and essentially lying on the lower bounding curve in height-width space). The uncorrected value is used for further processing, for example to update a pulse height spectrum by incrementing a count register for that value of H.

Where H' does not equal H, the value in the lookup table at location (H'W') is either a corrected height value or alternatively a zero.

Where the value in the lookup table at location (H'W') is non-zero, this is a corrected value of H. This corresponds to the lozenge area of the HW curve (that is, to pulses in class 2, lying between the lower and upper bounding curves in height-width space, deemed to be affected by depth effects but not pile up). The value of H (corrected from H') is used for further processing, for example to update a pulse height spectrum by incrementing a count register for that value of H.

Locations corresponding to a Class 2 pulse thus contain a bin value which is not equivalent to the pulse height but instead to a corrected value that reassigns the incorrect pulse to the appropriate bin based on its height width relationship.

A zero in the lookup table reflects the fact that H' and W' do not correlate to any (H, W) coordinates which are deemed to define a real pulse. That is, these are pulses in class 3. In particular such pulses are regarded as piled up and are therefore to be discarded. Thus, pulses for which (H'W')=0 are not added into the pulse height spectrum. However, in an optional additional step, the value W' for such events is added to a cumulative discard counter. Whilst the number of pulses in a given discard period or indeed the energy of such pulses is not know this feature provides a useful dead time counter which can be used to assess the percentage of dead time for a given acquisition.

The computation of H for a given H'W' may be too complex to be carried out in real time on an FPGA and in the example set out herein is carried out offline. A lookup table is generated containing the reassigned bin value for a given H' and W'. This may be of any required size and is a function of the sample rate and ADC used.

Figure 8:
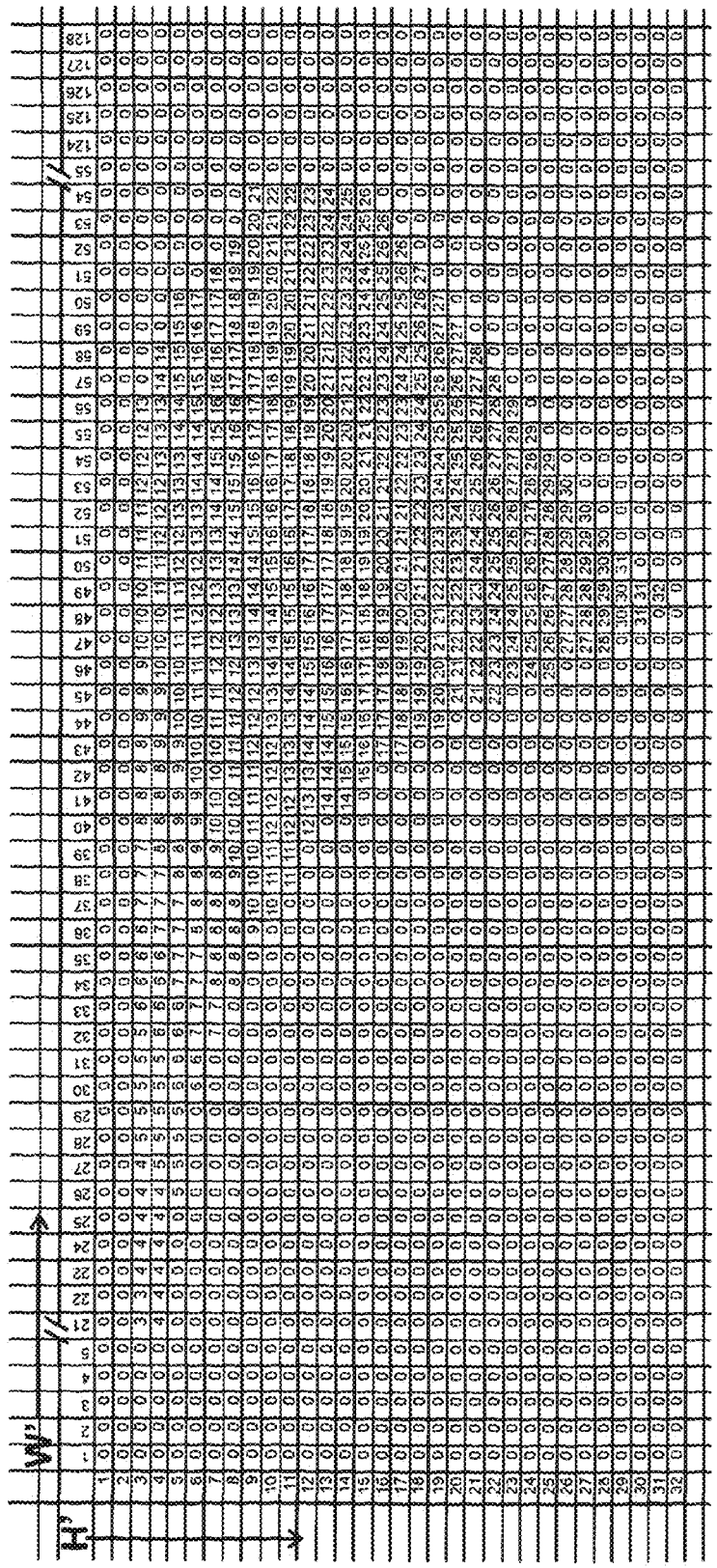
FIG. 8 is a 128×32 element lookup table used to correct depth of interaction effects by applying the transformation H', W'→H.

An example 128×32 element lookup table used to correct depth of interaction effects by applying the transformation H', W'→H is shown in FIG. 8. Note omitted cells contain zeros and refer to locations where H' and W' are uncorrelated due to pulse pile up.

In the example embodiment a 128×32 value lookup table is used. The resolution of the height field is equal to 1 bin which is equivalent to 31 mV and the resolution of the width field is from 0 to 128 samples with a sampling period of 5 ns. Cells corresponding to class 3 contain a zero and represent a location for which there is no (H',W') to (H,W) correlation. Any pulse which looks up such a location is returned as a zero meaning that it is discarded. Cells corresponding to class 2 (the lozenge region) correlate (H',W') to a corrected H. The lookup table is used to map the events in the lozenge region onto the minimum HW curve. Cells corresponding to class 1 are those where (H',W') correlates directly to (H,W).

Figure 9:
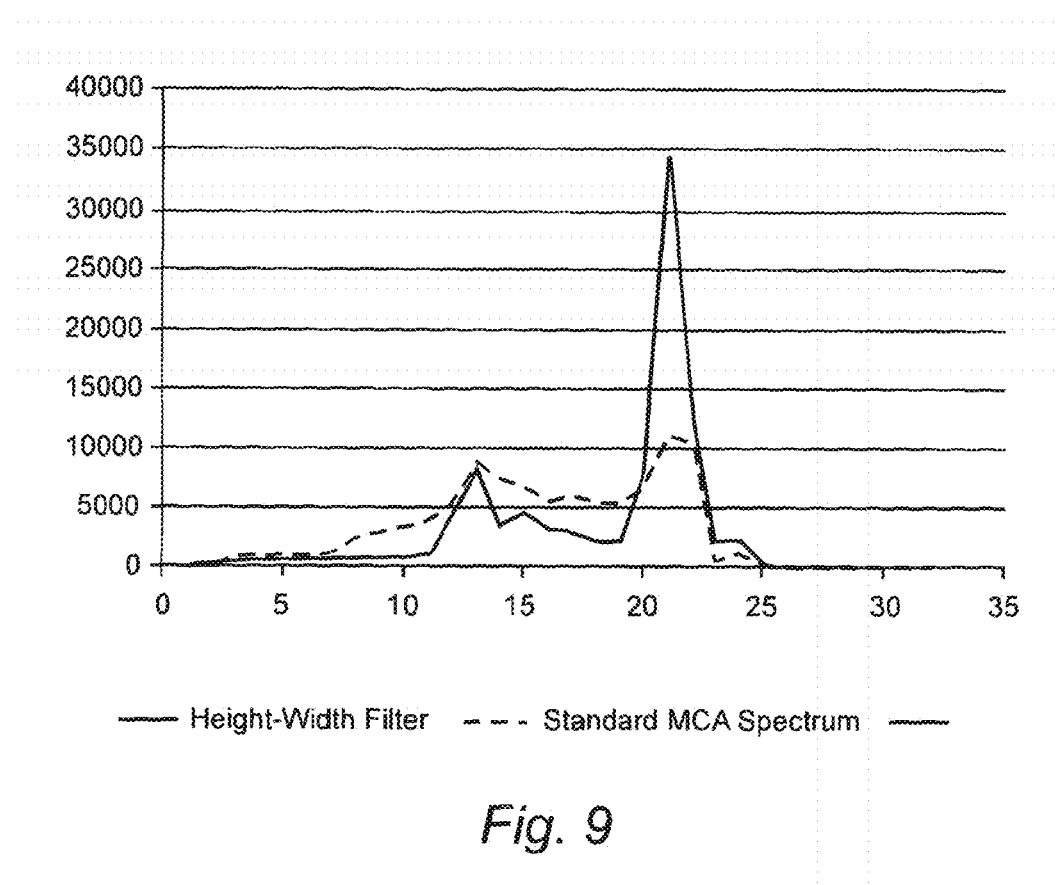
FIG. 9 is a graphical illustration a spectrum corrected in accordance with the principles of the invention.

FIG. 9 shows the spectrum both before and after depth of interaction correction. The corrected spectrum shows a marked improvement in resolution.

The invention claimed is:

1. A method of processing of detected radiation data from a semiconductor detector device comprising:
   detecting an event at the semiconductor detector device;
   producing a pulse;
   determining for the pulse:
      a pulse height measurement representative of pulse magnitude; and
      a pulse width measurement representative of pulse duration;
   assigning, by a programmable apparatus, the pulse to one of at least two classes based on one or more of the pulse height measurement and the pulse width measurement; and
   the programmable apparatus applying to the pulse an algorithm specific to its particular class to produce an output pulse height/pulse width profile comprising one or more modified values, wherein the applying comprises modifying at least one of the pulse height measurement and the pulse width measurement to produce the one or more modified values, the one or more modified values comprising at least one of a modified pulse height value and a modified pulse width value.

2. A method in accordance with claim 1 further comprising using the output pulse height/pulse width profile for further processing.

3. A method in accordance with claim 1 wherein the at least two classes are defined by defining bounding conditions around regions in pulse height/pulse width space.

4. A method in accordance with claim 3 wherein:
   the pulse is assigned to:
      (i) a first class if the pulse, as represented by the pulse height measurement and the pulse width measurement, is plotted within a threshold range of a first notional bounding condition of pulse height/pulse width values;
      (ii) subject to (iii) below, a second class if the pulse, as represented by the pulse height measurement and the pulse width measurement, is plotted outside the threshold range; and
      (iii) a third class if the pulse is in compliance with (ii) above but the pulse fails to meet an acceptance criterion;
   and the applying comprises:
      (a) if the pulse is assigned to the first class, applying a first algorithm to produce the output pulse height/pulse width profile, and using the output pulse height/pulse width profile for further processing;
      (b) if the pulse is assigned to the second class, applying a second algorithm to produce the output pulse height/pulse width profile, and using the output pulse height/pulse width profile for further processing; and
      (c) if the pulse is assigned to the third class, discarding the pulse.

5. A method in accordance with claim 1 comprising assigning a particular pulse to one of a plurality of classes that are subject to different processing algorithms, at least one of which makes no modification such that a produced output pulse height/pulse width profile is thus unmodified, and the method comprises using the produced output pulse height/pulse width profile without modification for further processing.

6. A method in accordance with claim 1 comprising assigning a particular pulse to one of a plurality of classes including a first class and a second class and processing such that:
   (a) if the particular pulse is assigned to the first class, using at least one of a pulse height measurement of the particular pulse and a pulse width measurement of the particular pulse without further correction for further processing; and
   (b) if the pulse is assigned to the second class, applying a correction to modify at least one of the pulse height measurement of the particular pulse and the pulse width measurement of the particular pulse to produce at least one modified value and using the at least one modified value for further processing.

7. A method in accordance with claim 1 wherein data from a plurality of pulses is used to generate a cumulative spectrum dataset from data from pulses assigned to at least some of the at least two classes.

8. A method in accordance with claim 7 wherein the cumulative spectrum dataset comprises a pulse height spectrum generated from pulse heights subjected to a first algorithm from pulses assigned to a first class and pulse heights subjected to a second algorithm from pulses assigned to a second class.

9. A method in accordance with claim 7 wherein the cumulative spectrum dataset comprises a pulse height spectrum generated from uncorrected pulse heights from pulses assigned to a first class and modified pulse heights from pulses assigned to a second class.

10. A method in accordance with claim 9 wherein the pulse height spectrum comprises a stored histogram type dataset of cumulative pulse heights at a plurality of pulse height values and the applying comprises:
  (a) if the pulse is assigned to the first class, adding a count to the pulse height spectrum based on the pulse height measurement;
  (b) if the pulse is assigned to the second class, applying a correction to modify the pulse height measurement to produce the modified pulse height value, and then adding a count to the pulse height spectrum based on the modified pulse height value; and
  (c) if the pulse is assigned to a third class, discarding the pulse.

11. A method in accordance with claim 10, wherein the pulse is assigned to one of three classes comprising the first class, the second class and a third class as follows:
  (i) the first class if the pulse, as represented by the pulse height measurement and the pulse width measurement, is plotted within a threshold range of a first bounding curve on a notional pulse width/pulse height plot;
  (iii) a second class if the pulse, as represented by the pulse height measurement and the pulse width measurement, is plotted above the upper bound of the threshold range but below a second bounding curve on the notional pulse width/pulse height plot a notional pulse height/pulse width plot; and
  (iii) a third class if the pulse, as represented by the pulse height measurement and the pulse width measurement, is otherwise than in compliance with (i) or (ii) above.

12. A method in accordance with claim 1 wherein the applying comprises assigning to the pulse a modified pulse energy reading, substituting the modified pulse energy reading for an equivalent reading corresponding to or derivable from one or more of the pulse height measurement and the pulse width measurement, and using the modified pulse energy reading as a basis for updating a pulse height spectrum.

13. A method in accordance with claim 12 wherein the applying comprises applying a transfer function to a given measured pulse height/pulse width profile to derive therefrom at least a modified pulse height reading.

14. A method in accordance with claim 12 wherein a reference data register is provided in which a plurality of modified pulse heights are stored, each respectively linked to a corresponding measured pulse height/pulse width profile, and the applying comprises obtaining therefrom the modified pulse height for a given measured pulse height/pulse width profile, and substituting the modified pulse height for an equivalent measured reading.

15. A method in accordance with claim 1 comprising:
  causing radiation to impinge on a face of the semiconductor detector device;
  measuring a radiation pulse from radiation incident at the semiconductor detector device;
  assigning the radiation pulse to one of the at least two classes based on the measuring; and
  applying to the radiation pulse an algorithm specific to its particular class to produce an output radiation-pulse height/radiation-pulse width profile.

16. A device for radiation detection adapted to implement the method of claim 1.

17. A device for radiation detection comprising:
  a semiconductor radiation detector;
  a pulse event detection module to detect an event at the semiconductor radiation detector by sampling a response of the semiconductor radiation detector, and generate a pulse with a pulse height measurement representative of pulse magnitude and a pulse width measurement representative of pulse duration;
  a data processing module implemented on a programmable apparatus, wherein the data processing module is adapted to:
    analyse the pulse height measurement and the pulse width measurement of the pulse;
    assign the pulse to one of at least two classes based on at least one of the pulse height measurement and the pulse width measurement; and
    apply to the pulse an algorithm specific to its particular class to produce an output pulse height/pulse width profile comprising one or more modified values, wherein the application of the pulse comprises modifying at least one of the pulse height measurement and the pulse width measurement to produce the one or more modified values, the one or more modified values comprising at least one of a modified pulse height value and a modified pulse width value.

18. A device in accordance with claim 17 wherein the data processing module uses the output pulse height/pulse width profile of the pulse for further processing.

19. A device in accordance with claim 18 wherein the data processing module provides that at least one algorithm makes no modification such that the data processing module is adapted to use a produced output pulse height/pulse width profile without modification for further processing.

20. A device in accordance with claim 17 further comprising a data storage module to store pulse height readings and/or data derived therefrom.

21. A device in accordance with claim 20 wherein the data storage module is adapted to store data derived from a plurality of pulses as a cumulative spectrum dataset derived from pulses assigned to at least some of the at least two classes.

22. A device in accordance with claim 21 wherein the cumulative spectrum dataset comprises a pulse height spectrum generated from pulse heights subjected to a first algorithm from pulses assigned to a first class and pulse heights subjected to a second algorithm from pulses assigned to a second class.

23. A device in accordance with claim 21 wherein the cumulative spectrum dataset comprises a pulse height spectrum generated from uncorrected pulse heights from pulses assigned to a first class and modified pulse heights from pulses assigned to a second class.

24. A device in accordance with claim 17 wherein a reference data register is provided in which a plurality of modified pulse heights are stored, each respectively linked to a corresponding measured pulse height/pulse width profile, and the data processing module is adapted to read the reference data register, obtain therefrom the modified pulse height for a given measured pulse width/pulse height profile, and substitute the modified pulse height for an equivalent measured value.

25. A device in accordance with claim 17 wherein the semiconductor radiation detector is adapted to exhibit a spectroscopically variable response across at least a substantial part of a radiation spectrum in use.

26. A device in accordance with claim 25 wherein the semiconductor radiation detector is fabricated from a material that exhibits inherently as a direct material property a direct variable photoelectric response to different parts of the radiation spectrum in use.

27. A device in accordance with claim 26 wherein the semiconductor radiation detector is fabricated from a material selected from cadmium telluride, cadmium zinc telluride (CZT), cadmium manganese telluride (CMT), and alloys thereof.

28. A device in accordance with claim 27 wherein the semiconductor radiation detector is fabricated from a material that consists essentially of crystalline $Cd_{1-(a+b)}Mn_aZn_b Te$ where $a+b<1$ and a and/or b may be zero.

* * * * *